US007345482B2

(12) United States Patent
Saylor

(10) Patent No.: US 7,345,482 B2
(45) Date of Patent: Mar. 18, 2008

(54) HIGH-FIELD MODE-STABLE RESONATOR FOR MAGNETIC RESONANCE IMAGING

(75) Inventor: Charles A. Saylor, Gainesville, FL (US)

(73) Assignee: Invivo Corporation, Gainesville, FL (US)

(*) Notice: Subject to any disclaimer, the term of this patent is extended or adjusted under 35 U.S.C. 154(b) by 27 days.

(21) Appl. No.: 11/334,811

(22) Filed: Jan. 17, 2006

(65) Prior Publication Data

US 2006/0158190 A1    Jul. 20, 2006

Related U.S. Application Data

(60) Provisional application No. 60/643,963, filed on Jan. 14, 2005.

(51) Int. Cl.
*G01V 3/00* (2006.01)

(52) U.S. Cl. .................. 324/318; 324/322

(58) Field of Classification Search .......... 324/318, 324/322
See application file for complete search history.

(56) References Cited

U.S. PATENT DOCUMENTS

| 4,506,224 A | 3/1985 | Krause |
| 4,638,253 A | 1/1987 | Jaskolski et al. |
| 4,680,548 A | 7/1987 | Edelstein |
| 4,751,464 A | 6/1988 | Bridges |
| 5,053,711 A | 10/1991 | Hayes |
| 5,132,621 A | 7/1992 | Kang |
| 5,477,145 A | 12/1995 | Takahashi et al. |
| 5,557,247 A | 9/1996 | Vaughn, Jr. |
| 6,411,090 B1 | 6/2002 | Boskamp |
| 6,535,084 B1* | 3/2003 | Tropp .................. 333/219 |
| 6,608,480 B1 | 8/2003 | Weyers |
| 6,714,013 B2 | 3/2004 | Misic |
| 2003/0184298 A1 | 10/2003 | Heid et al. |

FOREIGN PATENT DOCUMENTS

EP    0 084 946 A    8/1983

OTHER PUBLICATIONS

King, Scott B. et al., A Four Channel Transceive Phased Array Head Coil for 3T, *Proc. Intl. Soc. Mag. Reson. Med*, 2001, p. 12, vol. 9.
Moeller, S. et al., Parallel Imaging performance for densely spaced coils in phase arrays at ultra high field strength, *Proc. Intl. Soc. Mag. Reson. Med.*, 2004, vol. 11.
Vaughan, J.T., Detunable Transverse Electromagnetic (TEM) Volume Coil for High-Field NMR, *Magnetic Resonance in Medicine*, 2002, pp. 990-1000, vol. 47.

(Continued)

*Primary Examiner*—Louis M. Arana
(74) *Attorney, Agent, or Firm*—Saliwanchik, Lloyd & Saliwanchik

(57) ABSTRACT

Embodiments of the invention pertain to a resonator for use in magnetic resonance imaging. Embodiments of the subject invention pertain to a high-field mode-stable resonator for use in magnetic resonance imaging. Embodiments also pertain to a method of generating and/or receiving rf magnetic fields in a field of view (FOV) for magnetic resonance imaging. An embodiment can incorporate a shielded cylindrical resonator having 16 elements that are coupled to one another by a transmission line resonator.

24 Claims, 8 Drawing Sheets

OTHER PUBLICATIONS

Ballon, D. et al., A 64 MHz Half-Birdcage Resonator for Clinical Imaging, *Journal of Magnetic Resonance*, 1990, pp. 131-140, vol. 90, No. 1, Academic Press, Inc., Orlando, FL, US.

Bimson, W.E. et al., An Elliptical Cross Section Birdcage Body Coil, *Book of Abstracts of the 11th Annual Scientific Meeting (Held Jointly with the Ninth Annual Congress of the European Society for Magnetic Resonance in Medicine and Biology), Meeting and Exhibition of the Society of Magnet*, Aug. 8-14, 1992, p. 272, vol. 1, Meeting 11, Berlin, Germany.

Joseph, P.M. et al., A Technique for Double Resonant Operation of Birdcage Imaging Coils, *IEEE Transactions on Medical Imaging*, Sep. 1, 1989, pp. 286-294, vol. 8, No. 3, IEEE Service Center, Piscataway, NJ, US.

Murphy-Boesch, J. et al., A Single-Tuned Four Ring Birdcage Resonator for High $B_1$ Homogeneity, *Book of Abstracts of the 10th Annual Scientific Meeting and Exhibition, Meeting and Exhibition of the Society of Magnetic Resonance in Medicine*, Aug. 10, 1991, p. 125, vol. 1, Meeting 10, Berkeley, SMRM, US.

* cited by examiner

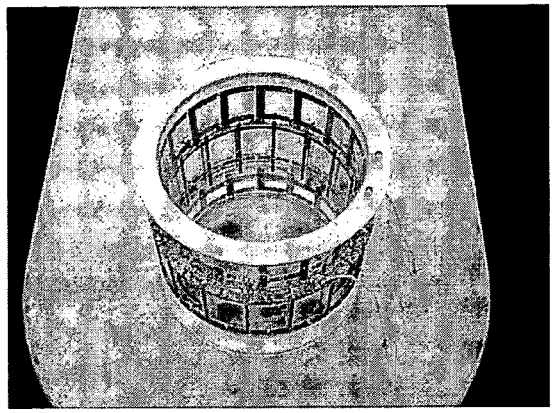
FIG. 15A
FIG. 15B
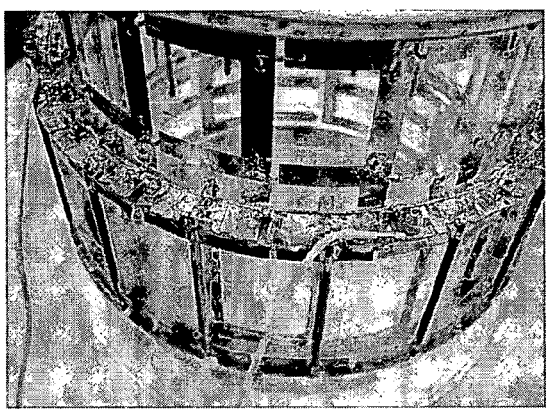
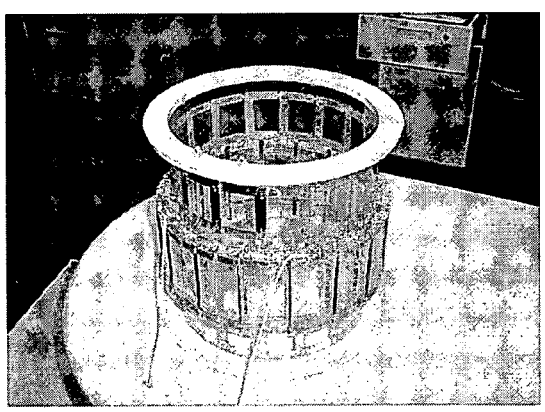
FIG. 15C
FIG. 15D
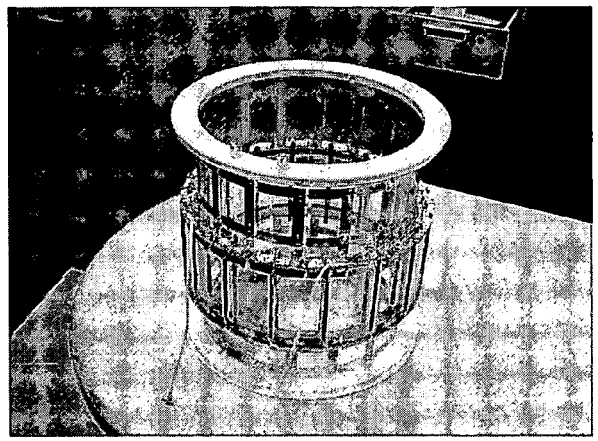

HIGH-FIELD MODE-STABLE RESONATOR FOR MAGNETIC RESONANCE IMAGING

CROSS REFERENCE TO RELATED APPLICATION

The present application claims the benefit of U.S. provisional patent application Ser. No. 60/643,963, filed Jan. 14, 2005, which is hereby incorporated by reference herein in its entirety, including any figures, tables, or drawings.

BACKGROUND OF INVENTION

Presently, the three primary designs for high frequency volume coils are a shielded quad Helmholtz pair coil, a birdcage coil, and a TEM coil.

BRIEF DESCRIPTION OF DRAWINGS

FIGS. 15A-15D show photographs of a resonator in accordance with an embodiment of the subject invention.

DETAILED DISCLOSURE

Embodiments of the invention pertain to a resonator for use in magnetic resonance imaging. Embodiments of the subject invention pertain to a high-field mode-stable resonator for use in magnetic resonance imaging. Embodiments also pertain to a method of generating and/or receiving rf magnetic fields in a field of view (FOV) for magnetic resonance imaging. Decoupling circuitry, not shown, can allow embodiments of the subject resonator to be utilized for generating and receiving rf magnetic fields in a field of view.

Figure 1:
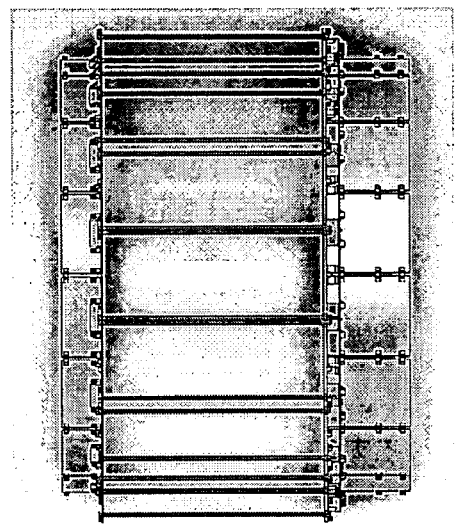
FIG. 1 shows a side view of a resonator in accordance with an embodiment of the subject invention.

FIG. 1 shows a side view of a specific embodiment of the subject resonator. The left side of the image is the inferior end of the coil and the right side is the superior side of the coil. Breaking the coil into three sections:

1. The left/inferior end is an rf shield made of copper foil tape which is capacitively broken. This results in a rf shield that contains the rf energy while being transparent to the low frequency gradient pulses.
2. The center section is the primary component of the subject shielded rf resonator. The shield of the center section is made up of 16 pieces of 0.125 in diameter copper pipe that are approximately 6 inches long. The ends of each of these copper tubes is connected to copper foil sheet that form a ring shield at each end of the center section.
3. The superior end of the coil is also an rf shield made of capacitively coupled of tape.

Although the embodiment shown in FIG. 1 includes an rf shield at the inferior end and an rf shield at the superior end, alternative embodiments of the subject invention can remove one or both of these rf shields.

In a specific embodiment, the conductors that are internal to the shield in the center part of the rf resonator go through a hole in the ring shield and are connected by capacitors to the outside of the shield. Making the capacitive connection outside of the shield advantageously keeps the high electric fields associated with the capacitor outside of the shield.

Figure 11:
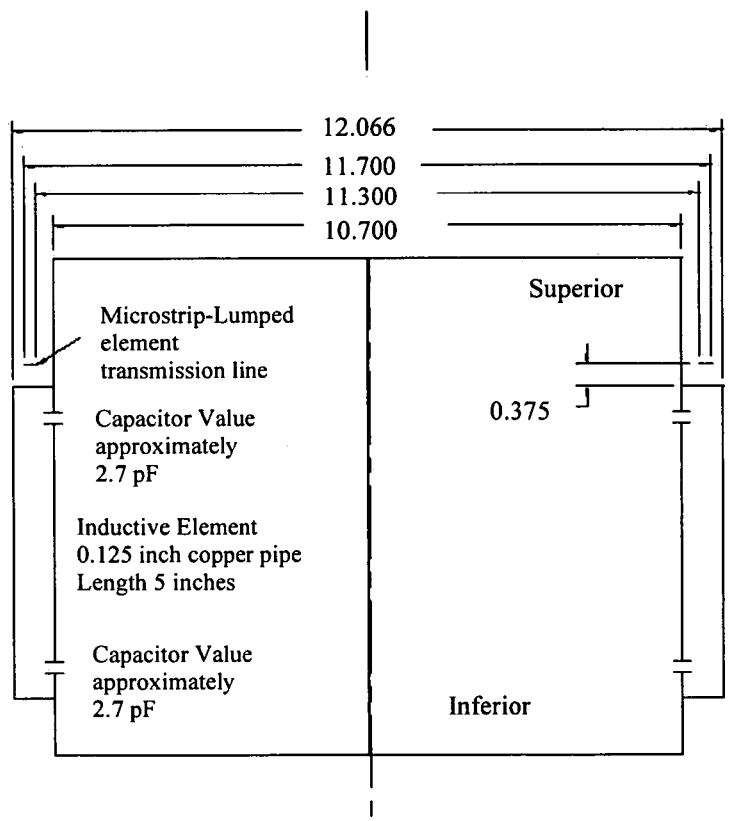
FIG. 11 shows a schematic of a side view cross-section of a plurality of elongated conductors, shield, and transmission line resonator for a resonator in accordance with an embodiment of the subject invention.

In a specific embodiment, the rf magnetic field, in the field of view (FOV), of the resonant mode, of the center structure, is similar to that shown in FIG. 11 of U.S. Pat. No. 5,557,247. The resonant structure within the shield of the subject resonator can be tuned so that the two orthogonal M=1 modes, also known as the imaging modes, are at the resonant frequency of the proton nucleus. The subject resonator can incorporate an extra resonant structure external to the shield. This extra resonant structure external to the shield can be strongly coupled to the resonant structure within the shield. The coupling can be accomplished, for example, across capacitors. In a specific embodiment, the external resonant structure is a transmission line resonator. In this way, the combination of the resonant structure within the shield and the transmission line resonator can behave as a single resonant structure.

The transmission line resonator can be constructed of microstrip sections and lumped elements. This transmission line resonator can be tuned to the M=1 mode while it is not coupled to the resonant structure within the shield. The transmission line resonator can provide a cyclic boundary condition transmission resonator that is one wavelength long at the resonant frequency. The design of the transmission line resonator can permit a large spacing in the frequency domain between the M=1 mode and both the M=0 and the M=2 modes. By coupling the resonant structure that is internal to the shield and the one external to the shield we obtain a new resonant structure that has a large spacing between modes in the frequency domain. In a specific embodiment, the spacing between M=1 mode and both the M=0 mode and the M=2 mode is a factor of 3, or more, greater than the bandwidth of the resonant. Preferably, the spacing is large enough such that the M=0 mode has less than 20% of the energy, more preferably less than 10% of the energy, and even more preferably, less than 5% of the energy. This large spacing permits us to substantially maintain the current distribution of the imaging mode even if the coil is heavily loaded, such as when an object to be imaged is inserted inside the resonator.

Figure 2:
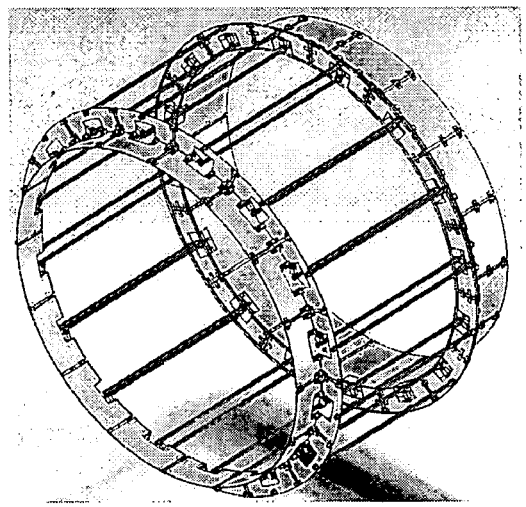
FIG. 2 shows an angled view of a resonator in accordance with an embodiment of the subject invention.
Figure 3:
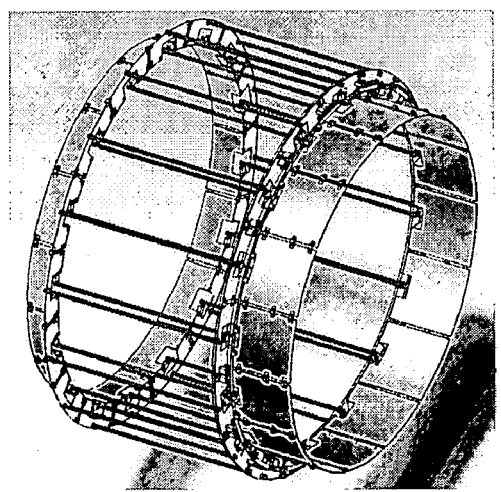
FIG. 3 shows an angled view of a resonator in accordance with an embodiment of the subject invention.

The coil in the embodiment of the subject invention shown in FIGS. 1, 2, and 3 is a shielded cylindrical resonator having 16 elements that are coupled to one another by a transmission line resonator. Embodiments of the shielded resonator can also have an elliptical cross section transverse to the central axis of the resonator. In specific embodiments, the ratio of the minor axis of the elliptical cross-section to the major axis is 0.8 or greater. The cylinder, or ellipse, is positioned in the MR scanner such that the axis of the cylinder, or ellipse, is parallel to the static magnetic field of the MR scanner. The three primary components of the resonator are a shield, 16 elements of the resonator, and a transmission line resonator. Alternative embodiments can have a different number of elements. Preferably an even number of elements is used. Specific embodiments have 4, 6, 8, and 32 elements, where the number of elements is not limited to powers of 2.

Figure 4:
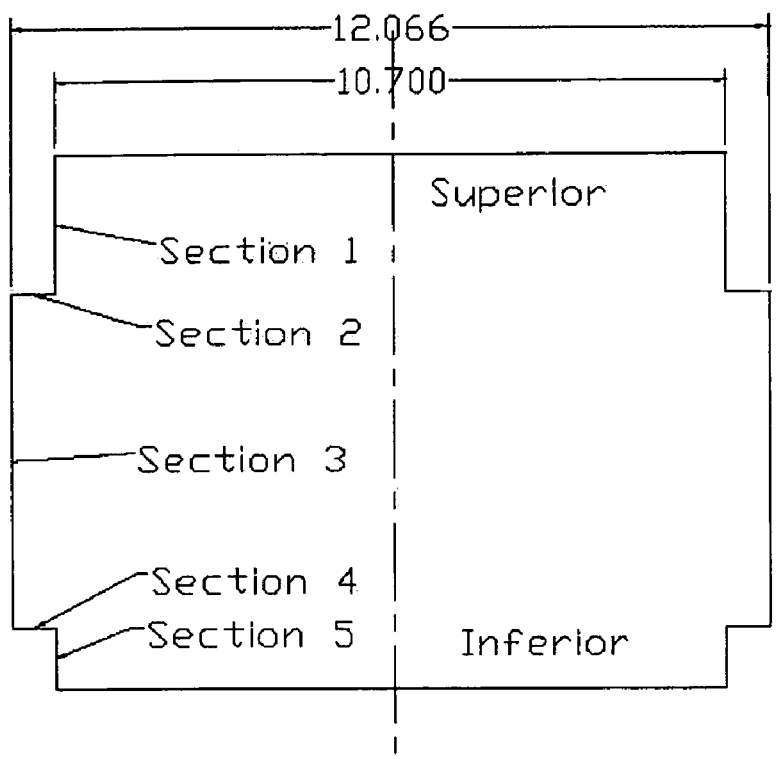
FIG. 4 shows a schematic of the cross-section of a shield in accordance with an embodiment of the subject invention.

In an embodiment, the shield is made in five sections along the z axis (z axis is defined by the static magnetic field direction in a horizontal field magnet). The shield lets gradient fields pass and shields rf fields. Referring to FIG. 4, section 1 and 5 are conductive cylinders, (Diameter 10.7 inches, section 1 has a length of 2.25 inches, section 5 has a length of 1.2 inches), made of a capacitively coupled segmented copper foil. Again, one or both of the sections 1 and 5 shield section can be removed, as can one or both of the section 2 and 4. In a specific embodiment, the transmission line resonator can be located adjacent section 2 of the shield and travel the circumference of the resonator. Preferably, the length of the transmission line resonator is one wavelength at resonance, such that a relationship exists between the strength of the static magnetic field, the resonant frequency, and the length of the transmission line resonator.

Sections 2 and 4 in the embodiment shown in FIGS. 1-3 are copper foil rings in the transverse plane with an inside diameter of 10.7 inches and an outside diameter of 12.25 inches. The radial breaks are used for low frequency segmentation using, for example, two 1000 pF capacitors. Section 3 incorporates 16 pieces of 0.125 inch outside diameter copper tubing uniformly distributed about the around a 12.066 inch diameter cylinder the length of this segment is 5.44 inches. Of course these dimensions are for specific embodiments and other combinations can be used as well. In specific embodiments, the elements can be rods, tubing, foil, or other appropriate shapes. Also, the shield rings could go out rather than in, but this would take up more annular volume. In an embodiment, one or both of the end shield sections can have the same diameter as the center shield section and, optionally, the elements of the center section can turn and pass through holes in the shield. Advantageously, the use of small diameter tubing allows a person to see out through the subject resonator when the resonator is over the person's head. Of course, the inductive elements can be made of other materials such as foil or solid metal rods. In an embodiment, the shield can be a solid conductor, such as foil, designed to sufficiently suppress eddy currents.

Each of the elements in the resonator structure within the shield can include a capacitor connecting an inductive element, approx. 5 inches in length 0.125 diameter copper pipe, to the shield ring, and another capacitor connecting the other end of the inductive element to the other shield ring. Specific embodiments can break the inductive element into multiple segments that are connected by capacitors. The inductive elements can be made of other materials such as foil or solid metal rods. The use of tubes or rods allow a person to see out through the subject resonator when the resonator is over the person's head.

The transmission line can be constructed from a combination of microstrip and lumped elements to tune the transmission line to the resonant frequency. In an embodiment, the transmission line is a continuous line tuned to the first order mode, which is doubly degenerate, so that it is one full wavelength around the structure. In this case, doubly degenerate means the transmission line can support two current modes 90 degrees out of phase.

In the embodiment shown in FIGS. 1-3, the microstrip-lumped element transmission line is made of 16 elements. 12 of the 16 elements are identical and are made of a 1 pF capacitor between ground and a segment of microstrip, then another 1 pF cap to ground. The other four elements can be used to connect to the circuit. The length of each micro strip element is approximately $\frac{1}{16}$ the distance around the coil. Each of the segments is coupled to its nearest neighbor by a coupling/tuning cap. In an embodiment, the value of the coupling caps is about 15 pF.

After tuning the resonant frequency of each of the individual elements of the resonator so that the M=1 mode of the coupled mode is on resonance and the resonant frequency of the transmission line, each element of the resonator can be overcoupled to the transmission line. Alternative orders and techniques for tuning can also be used. Because of the parallel resonant structure of the resonant element and the overcoupling of the elements to the transmission line, each of the elements in the structure appears as a high impedance to the transmission line. This results in very little change in the resonant frequency of the either the transmission line or the resonant mode of the elements. The resonant frequency can then be final tuned to adjust for any small shifts.

Figure 14:
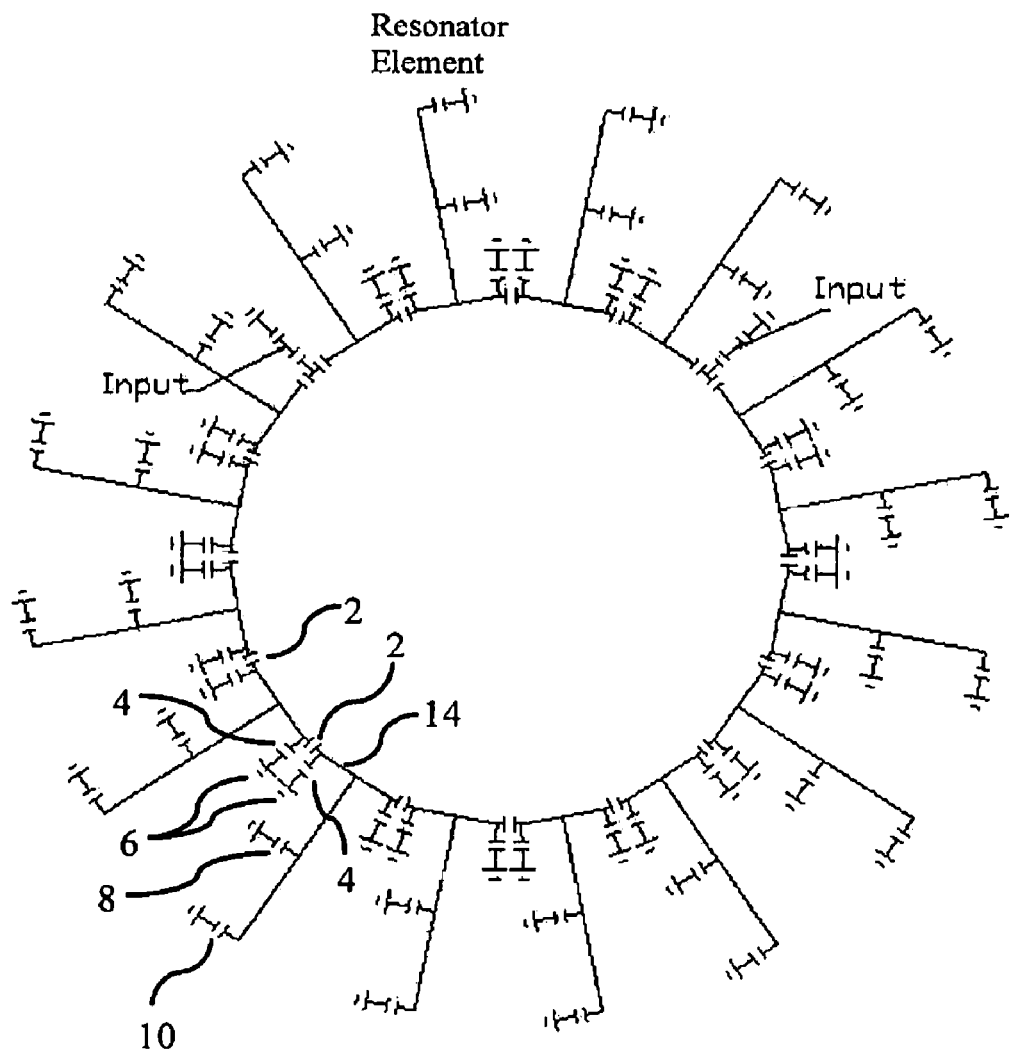
FIG. 14 shows the electrical connections between a transmission line resonator and a resonant structure in accordance with an embodiment of the subject invention.

Referring to FIG. 14, the electrical connections between the transmission line resonator and the resonator structure within the shield are shown. Each element 14 of the transmission line is capacitively coupled to its adjacent neighbor via capacitors 2. Each element 14 is capacitively coupled to ground 6 via capacitors 4, where ground is the outside shield of the middle section (shield section 3). Each element 14 is electrically connected to the inductive element 12 of the resonator structure within the shield. The inductive element is capacitively coupled to ground 6 via capacitors 8, where ground is the upper shield (shield section 1). Each inductive element 12 is capacitively coupled to ground 6 via capacitors 10, where ground is the lower shield (shield section 5).

In a specific embodiment, an end plate that is an rf conducting plate can be placed in the transverse plane of the resonator. The rf conducting plate can have capacitor breaks in such a way to be rf conducting. An rf conducting plate can be located on the end of the resonator where the transmission line is located and/or an rf conducting plate can be located on the opposite end of the resonator from the transmission line.

Figure 5:
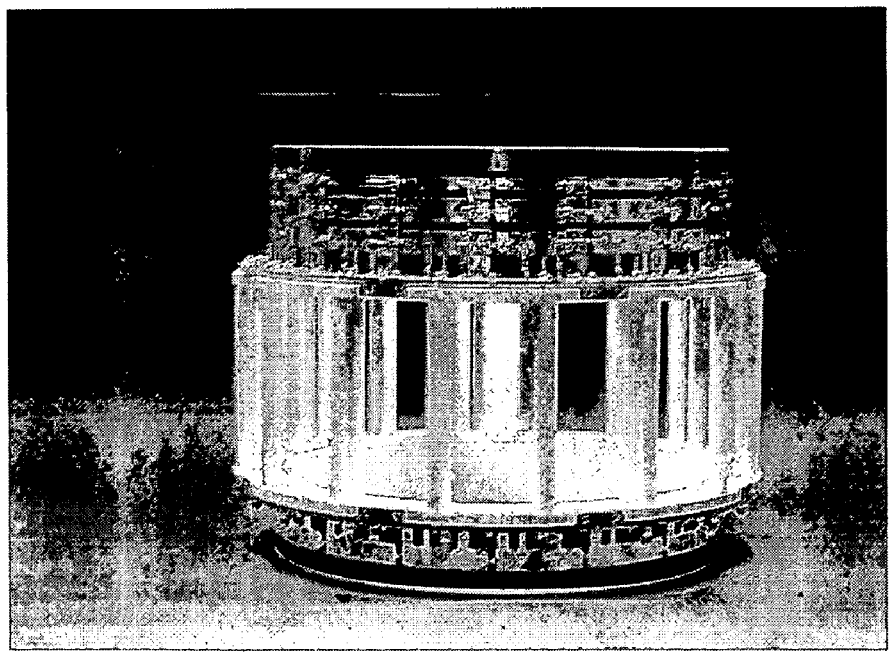
FIG. 5 shows a side view photograph of a resonator in accordance with an embodiment of the subject invention.
Figure 6:
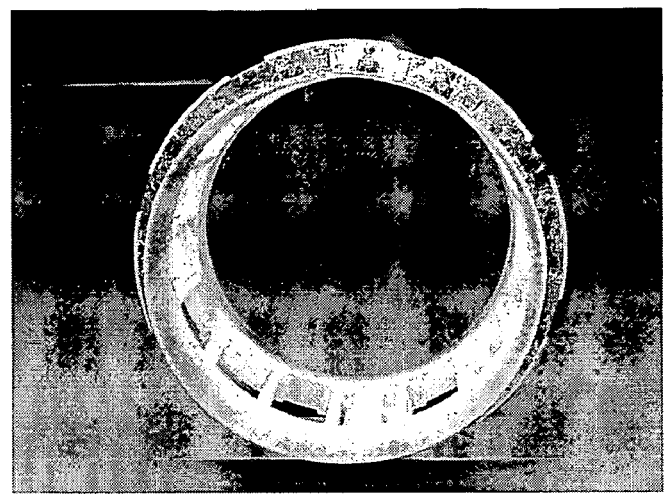
FIG. 6 shows an end view photograph of a resonator in accordance with an embodiment of the subject invention.
Figure 7:
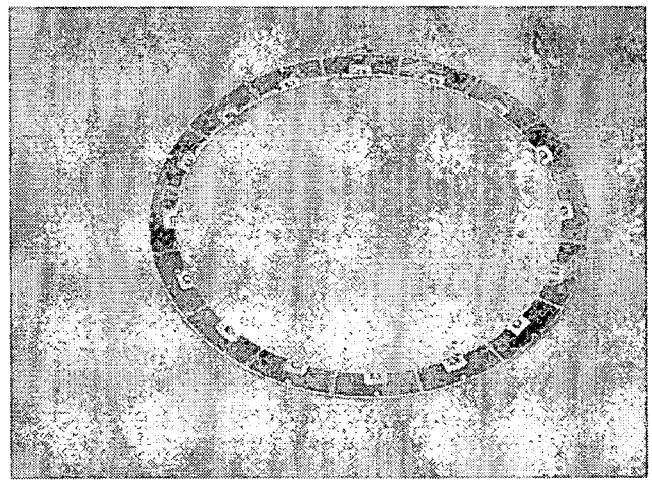
FIG. 7 shows a photograph of a foil ring for placement in the transverse plane in accordance with an embodiment of the subject invention.
Figure 8:
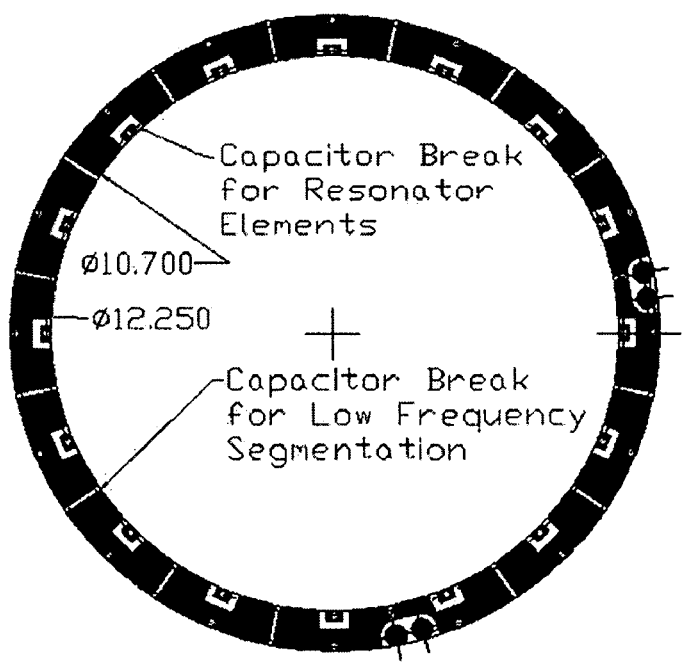
FIG. 8 shows a schematic of a foil ring for placement in the transverse plane in accordance with an embodiment of the subject invention.
Figure 9:
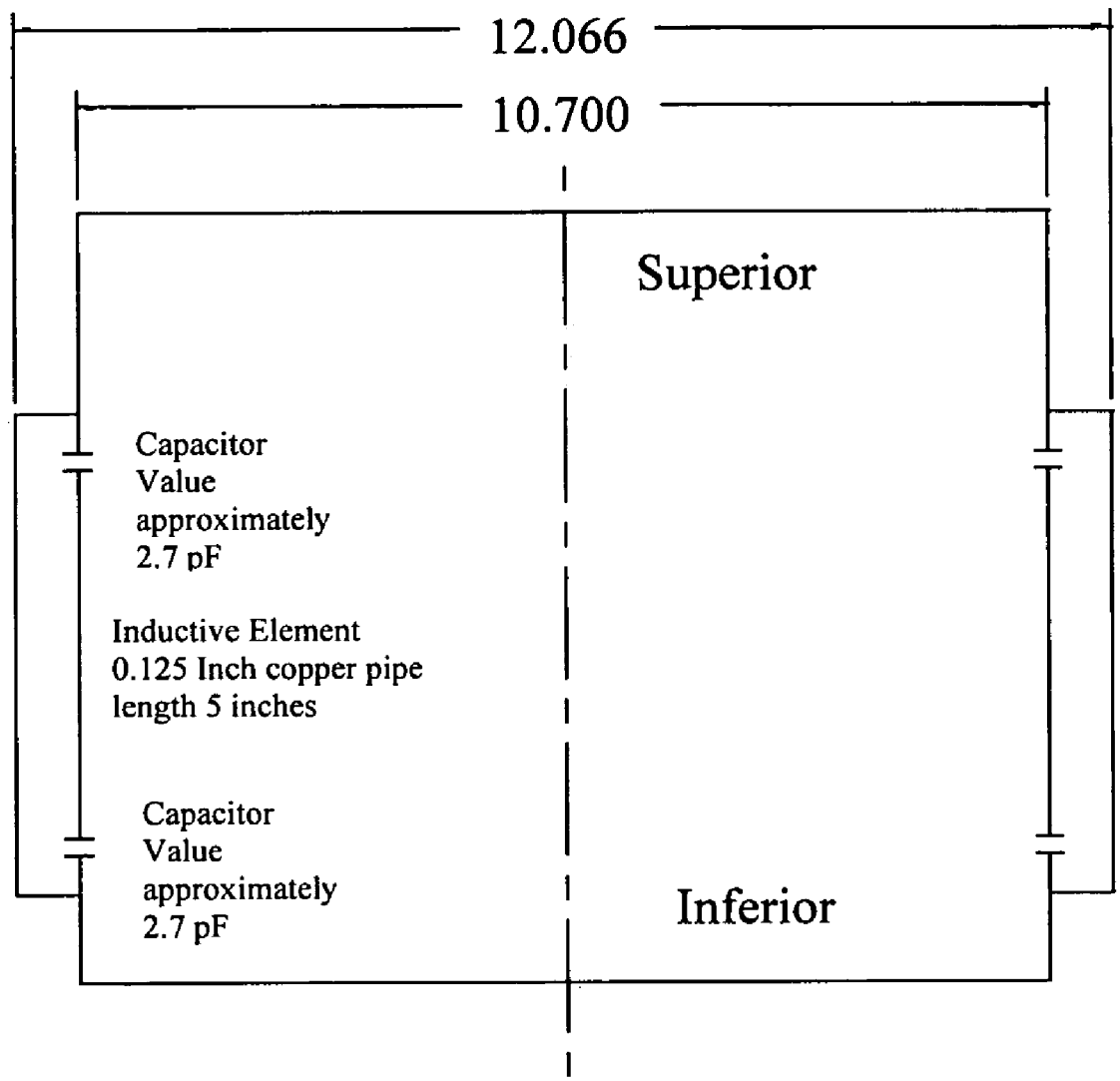
FIG. 9 shows a schematic of a side view cross-section of a plurality of elongated conductors and shield for a resonant structure in accordance with an embodiment of the subject invention.
Figure 10:
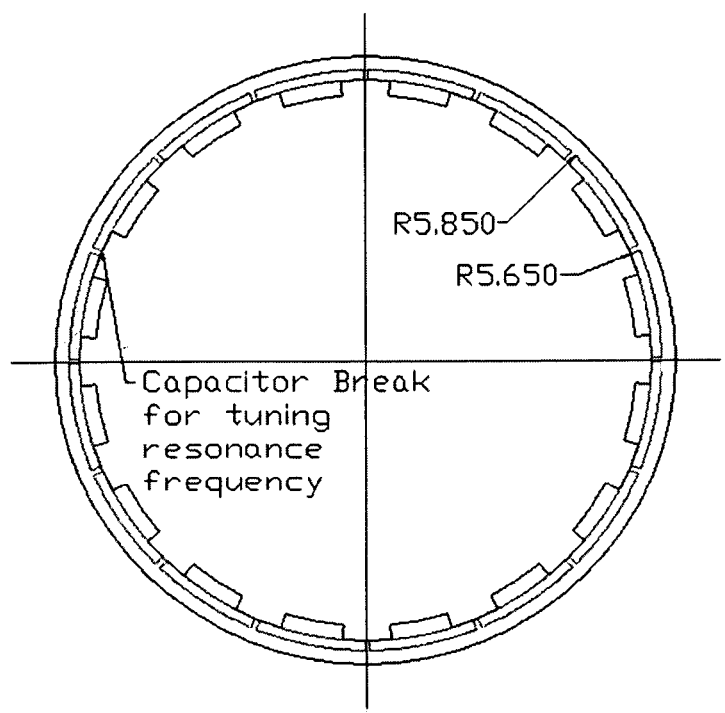
FIG. 10 shows a schematic of an end view cross-section of resonant structure in accordance with an embodiment of the subject invention.
Figure 12:
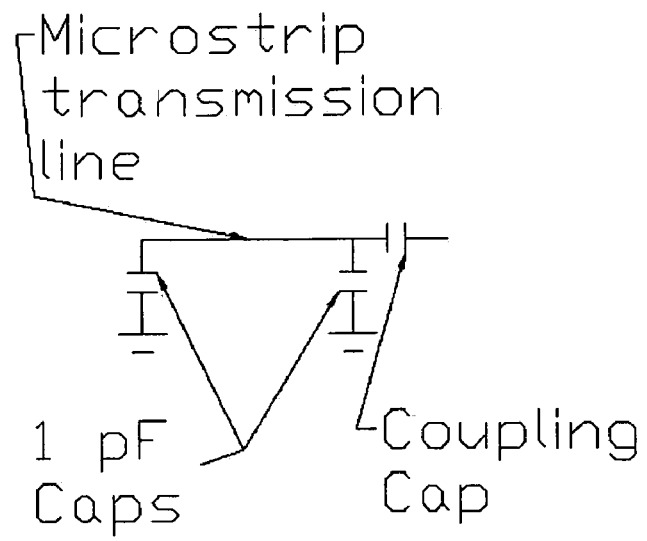
FIG. 12 shows a section of a transmission line resonator in accordance with an embodiment of the subject invention.
Figure 13:
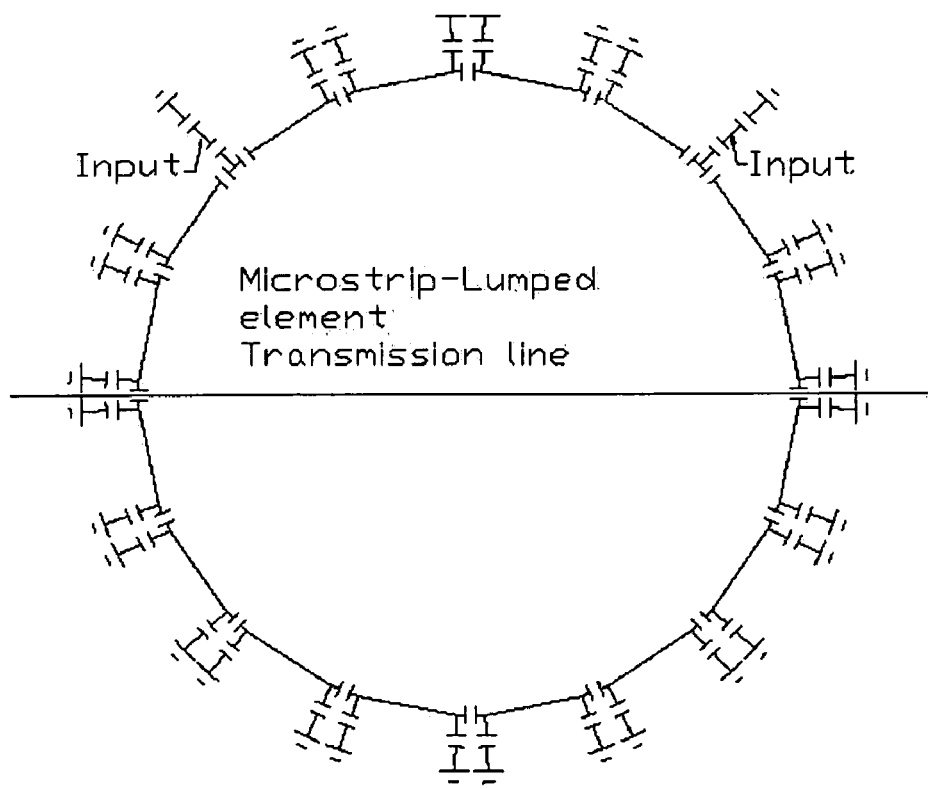
FIG. 13 shows a transmission line resonator in accordance with an embodiment of the subject invention.

FIG. 5 shows a side view photograph of a resonator in accordance with an embodiment of the subject invention. FIG. 6 shows an end view photograph of a resonator in accordance with an embodiment of the subject invention. FIG. 7 shows a photograph of a foil ring for placement in the transverse plane in accordance with an embodiment of the subject invention. FIG. 8 shows a schematic of a foil ring for placement in the transverse plane in accordance with an embodiment of the subject invention. FIG. 9 shows a schematic of a side view cross-section of a plurality of elongated conductors and shield for a resonant structure in accordance with an embodiment of the subject invention. FIG. 10 shows a schematic of an end view cross-section of resonant structure in accordance with an embodiment of the subject invention. FIG. 11 shows a schematic of a side view cross-section of a plurality of elongated conductors, shield, and transmission line resonator for a resonator in accordance with an embodiment of the subject invention. FIG. 12 shows a section of a transmission line resonator in accordance with an embodiment of the subject invention. FIG. 13 shows a transmission line resonator in accordance with an embodiment of the subject invention. FIGS. 15A-15D show photographs of a resonator in accordance with an embodiment of the subject invention.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

I claim:

1. A resonator for use in magnetic resonance imaging, comprising:
   a center section having a plurality of elongated conductors positioned substantially parallel to a center axis so as to have a substantially elliptical cross section in a plane transverse to the center axis, each of the plurality of elongated conductors having a first end and a second end that extend from a first end of the center section to a second end of the center section, respectively, wherein the plurality of elongated conductors form a first resonant structure having a corresponding plurality of coils;
   a center section shield, wherein the center section shield is positioned external to the first resonant structure; and
   a second resonant structure, wherein the second resonant structure is coupled to the first resonant structure.

2. The resonator according to claim 1, wherein the plurality of elongated conductors are positioned to have a substantially circular cross section in the plane transverse to the center axis.

3. The resonator according to claim 1, wherein the plurality of elongated conductors is a plurality of tubular conductors, wherein the center section shield comprises a corresponding second plurality of tubular conductors, wherein each of the corresponding second plurality of tubular conductors is positioned at the same angular position with respect to the center axis and farther away from the center axis as the corresponding tubular conductor of the plurality of tubular conductors.

4. The resonator according to claim 1, further comprising:
   a first rf end shield at the first end of the center section.

5. The resonator according to claim 4,
   wherein the first end of each of the plurality of elongated conductors passes through a hole in the first rf end shield and capacitively connects to the first rf end shield.

6. The resonator according to claim 4, further comprising:
   a second if end shield at the second end of the center section.

7. The resonator according to claim 6,
   wherein the second end of each of the plurality of elongated conductors passes through a hole in the second rf end shield and capacitively connects to the second rf end shield.

8. The resonator according to claim 1,
   wherein the second resonant structure is a transmission line resonator.

9. The resonator according to claim 8,
   wherein the first resonant structure and the second resonant structure behave as a single resonant structure and form a resonator, wherein with an rf magnetic field in the field of view (FOV) is defined by the first resonant structure and the frequency spacing of the resonant modes of the single resonant structure is controlled by the second resonant structure.

10. The resonator according to claim 9,
    wherein the resonator is a high-field mode-stable resonator.

11. The resonator according to claim 8,
    wherein the transmission line resonator is one wavelength long at the resonant frequency of the transmission line resonator.

12. The resonator according to claim 11,
    wherein there is a large spacing between the M=1 mode and the M=0 mode in the frequency domain.

13. The resonator according to claim 11,
    wherein there is a large spacing between the M=1 mode and the M=2 mode in the frequency domain.

14. The resonator according to claim 12,
    wherein there is a large spacing between the M=1 mode and the M=2 mode in the frequency domain, wherein the current distribution of the M=1 mode is substantially maintained when the resonator is heavily loaded.

15. The resonator according to claim 7,
    wherein the center section shield, the first rf end shield, and the second rf end shield form a shield, wherein the shield lets gradient fields pass and shields rf fields.

16. The resonator according to claim 4,
    wherein the first if end shield at the first end of the center section comprises a first section shield having the same cross section shape as the cross section shape of the center section shield and positioned to begin at the first end of the center section.

17. The resonator according to claim 6,
    wherein the second rf end shield at the second end of the center section comprises a second section shield having the same cross section shape as the cross section shape of the center section shield and positioned to begin at the second end of the center section.

18. The resonator according to claim 16,
    wherein the radius of the first section shield is different than the radius of the center section shield, further comprising a first annular section that is positioned to substantially fill the opening between the center section shield and the first section shield in the transverse plane.

19. The resonator according to claim 18,
    wherein the radius of the first section shield is smaller than the radius of the center section shield.

20. The resonator according to claim 17,
    wherein the radius of the second section shield is different than the radius of the center section shield, further comprising a second annular section that is positioned to substantially fill the opening between the center section shield and the second section shield in the transverse plane.

21. The resonator according to claim 4,
    wherein the first rf end shield and the center section shield form a shield, wherein the second resonant structure is external to the shield.

22. A method of magnetic resonance imaging, comprising:
- positioning a resonator in a static magnetic field of an MR scanner, wherein the resonator comprises:
- a center section having a plurality of elongated conductors positioned substantially parallel to a center axis so as to have a substantially elliptical cross section in a plane transverse to the center axis, each of the plurality of elongated conductors having a first end and a second end that extend from a first end of the center section to a second end of the center section, respectively, wherein the plurality of elongated conductors form a first resonant structure having a corresponding plurality of coils;
- a center section shield, wherein the center section shield is positioned external to the first resonant structure; and
- a second resonant structure, wherein the second resonant structure is coupled to the first resonant structure; and
- driving the resonator to excite an object to be imaged in MR scanner with rf magnetic fields.

23. The method according to claim 22, further comprising:
- receiving rf magnetic fields from the object to be imaged with the resonator.

24. A method of magnetic resonance imaging, comprising:
- positioning a resonator in a static magnetic field of an MR scanner, wherein the resonator comprises:
- a center section having a plurality of elongated conductors positioned substantially parallel to a center axis so as to have a substantially elliptical cross section in a plane transverse to the center axis, each of the plurality of elongated conductors having a first end and a second end that extend from a first end of the center section to a second end of the center section, respectively, wherein the plurality of elongated conductors form a first resonant structure having a corresponding plurality of coils;
- a center section shield, wherein the center section shield is positioned external to the first resonant structure; and
- a second resonant structure, wherein the second resonant structure is coupled to the first resonant structure; and
- receiving if magnetic fields from the object to be imaged with the resonator.

* * * * *

UNITED STATES PATENT AND TRADEMARK OFFICE
CERTIFICATE OF CORRECTION

PATENT NO. : 7,345,482 B2  Page 1 of 1
APPLICATION NO. : 11/334811
DATED : March 18, 2008
INVENTOR(S) : Saylor It is certified that error appears in the above-identified patent and that said Letters Patent is hereby corrected as shown below:

Column 5,
Line 61, "a second if end shield" should read --a second rf end shield--.

Column 8,
Line 21, "receiving if magnetic fields" should read --receiving rf magnetic fields--.

Signed and Sealed this

Thirtieth Day of September, 2008

JON W. DUDAS
*Director of the United States Patent and Trademark Office*